United States Patent [19]

Fritz

[11] Patent Number: 4,575,747

[45] Date of Patent: Mar. 11, 1986

[54] DEVICE FOR PROTECTING FILM-MOUNTED INTEGRATED CIRCUITS AGAINST DESTRUCTION DUE TO ELECTROSTATIC CHARGES

[75] Inventor: Otmar Fritz, Neukeferloh, Fed. Rep. of Germany

[73] Assignee: Siemens Aktiengesellschaft, Berlin & Munich, Fed. Rep. of Germany

[21] Appl. No.: 524,442

[22] Filed: Aug. 18, 1983

[30] Foreign Application Priority Data

Sep. 20, 1982 [DE] Fed. Rep. of Germany ....... 3234745

[51] Int. Cl.⁴ ..................... H01L 23/50; H01L 23/32; H03F 1/52
[52] U.S. Cl. ........................................ 357/70; 357/84; 174/52 FP
[58] Field of Search ............................. 361/212, 220; 357/23 GP, 84, 85, 70, 80; 206/328, 329, 334; 174/52 FP

[56] References Cited

U.S. PATENT DOCUMENTS

| | | | |
|---|---|---|---|
| 3,027,004 | 3/1962 | Gluck | 206/329 |
| 3,774,075 | 11/1973 | Medesha | 361/212 |
| 3,784,960 | 1/1974 | Bruckner | 357/85 |
| 3,820,152 | 6/1974 | Booth | 357/74 |
| 3,967,366 | 7/1976 | Birglechner et al. | 357/70 |
| 4,007,479 | 2/1977 | Kowalski | 357/70 |
| 4,069,496 | 1/1978 | Kowalski | 357/70 |
| 4,132,856 | 1/1979 | Hutchison et al. | 357/70 |
| 4,249,196 | 2/1981 | Durney et al. | 357/80 |

FOREIGN PATENT DOCUMENTS 2830937 1/1980 Fed. Rep. of Germany ...... 361/220

*Primary Examiner*—James W. Davie
*Assistant Examiner*—Vangelis Economou
*Attorney, Agent, or Firm*—Hill, Van Santen, Steadman & Simpson

[57] ABSTRACT

For the purpose of protecting film-mounted, integrated circuits (micropacks) against destruction due to electrostatic charging, each micropack is inserted in a mounting frame after it is cut from the film strip, is fixed there and tested. Subsequently, a short-circuit frame having conductive elements which short the outer track structures of the micropack is placed into the mounting frame and fixed there. The micropack remains between the two frames until its final assembly. The short-circuit frame is removable and reuseable.

11 Claims, 10 Drawing Figures

FIG 6.a
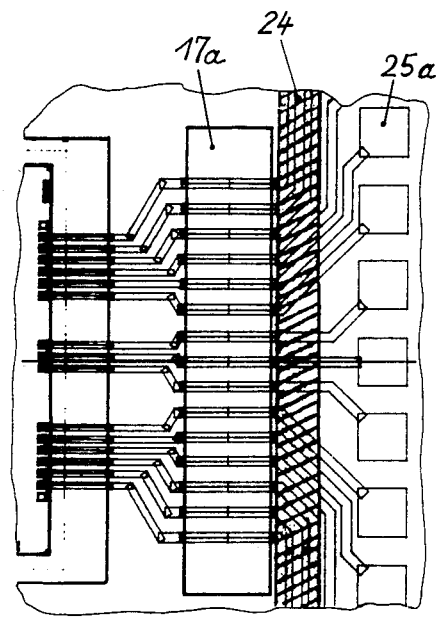
FIG. 6b
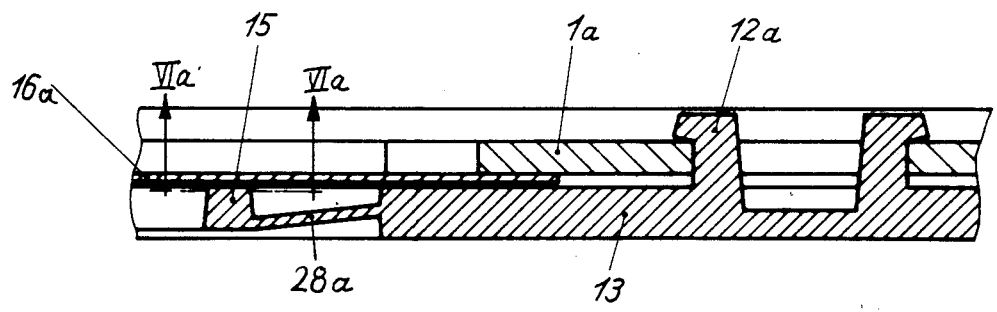

DEVICE FOR PROTECTING FILM-MOUNTED INTEGRATED CIRCUITS AGAINST DESTRUCTION DUE TO ELECTROSTATIC CHARGES

BACKGROUND OF THE INVENTION

1. Field of the Invention

This invention relates to a method and to a device for protecting film-mounted integrated circuits (micropacks) against destruction due to electrostatic charges when handling those circuits.

2. Description of the Prior Art

The sensitivity of integrated circuits in MOS technology to electrostatic charges is known. Such an electrostatic charge can be caused and can lead to the destruction of the circuits when handling the circuits themselves or the assemblies that are equipped with these circuits. However, even given circuits which are constructed in a technology different than MOS, a hazard to the circuits is not excluded. The hazard of electrostatic charge destruction increases in significance given an increasing integration density of such circuits. A general protection of integrated circuits against electrostatic charging is therefore necessary. This is especially true for circuits which are mounted in a film carrier and which are handled and processed as micropacks.

The standard method of protecting integrated circuits against electrostatic charging consists of short-circuiting or grounding the circuits. It is known, for example, given film-mounted circuits, to extend the track connections of the circuits beyond the outer contacting region and to combine the connections in one or more short-circuit points and to in turn connect these short-circuit points to a grounding track running along the entire film length.

The connections to the short-circuit points must be separated for the electrical check of an integrated circuit and thus must be re-connected to the grounding track for further manipulation after the check. This can occur, for example, by cutting out the short-circuit points before the check, and after the check, reclosing the points with a solder rivet. Because of the small dimensions of the cut-out short-circuit points, this method requires high-precision work when re-connecting the points and, with current technology, can only be manually executed.

It has therefore already been proposed to design the track connections of the integrated circuits such that a conductive surface is provided in the track between the short-circuit point and the grounding track, that surface connecting these two to one another, being separated therefrom at two sides and being disposed above a cut-out in the film and dimensioned such that, after the third side is cut, it can be folded over the fourth side such that it covers all conductors leading to the short-circuit point. Although this measure has already led to very good results, it cannot be applied everywhere where, because of the multitude of connections of the integrated circuit, space no longer exists for the accommodation of such a surface.

SUMMARY OF THE INVENTION

It is therefore an object of the present invention to specify a method and a device for protecting film-mounted, integrated circuits (micropacks) against destruction due to electrostatic charges with which a short-circuiting of the outer track structures of the micropack can be achieved in a simple and nonetheless reliable manner even given integrated circuits having a great number of outer connections. This objective is achieved according to the inventive method in that each micropack is placed into a mounting frame and fixed there after it has been cut from the film strip; in that the micropack is subsequently checked in the frame; in that, subsequently, a second frame which shorts the outer track structures of the micropack is placed in the mounting frame and is secured there; and in that the micropack remains between the two frames until its final assembly. Both film-mounted, integrated circuits without short-circuit tracks as well as those having short-circuit tracks can be protected with this inventive method whereby, given those integrated circuits wherein the outer track connections are extended beyond the contacting area and combined in a short-circuit point, the short-circuit points are punched or cut out after the insertion of the micropack in the mounting frame.

While avoiding work which is difficult to execute at the individual track connections or the short-circuit points of the micropack and even given micropacks having a very large number of connections, it is possible as a result of the present inventive method to achieve excellent protection against destruction due to electrostatic charging. A further advantage is that the micropacks remain protected until their final assembly and are only subsequently freed from the protective device by means of a very simple manipulation. It is also advantageous that the inventive device can be re-employed at any time.

BRIEF DESCRIPTION OF THE DRAWINGS

Further details of the invention derive from the following description of a number of advantageous sample embodiments of the inventive device with reference to the Figures, whereby

FIG. 6a is a partial view of the integrated circuit of FIG. 5 showing the area contacted by the conductive element of the alternative embodiment of the short-circuit frame of FIG. 3a taken generally along the lines VIa—VIa of FIG. 6b;

FIG. 6b is a partial side sectional view of the assembled mounting frame, micropack of FIG. 5 and short-circuit frame of FIG. 3a.

DESCRIPTION OF THE PREFERRED EMBODIMENTS

Figure 1:
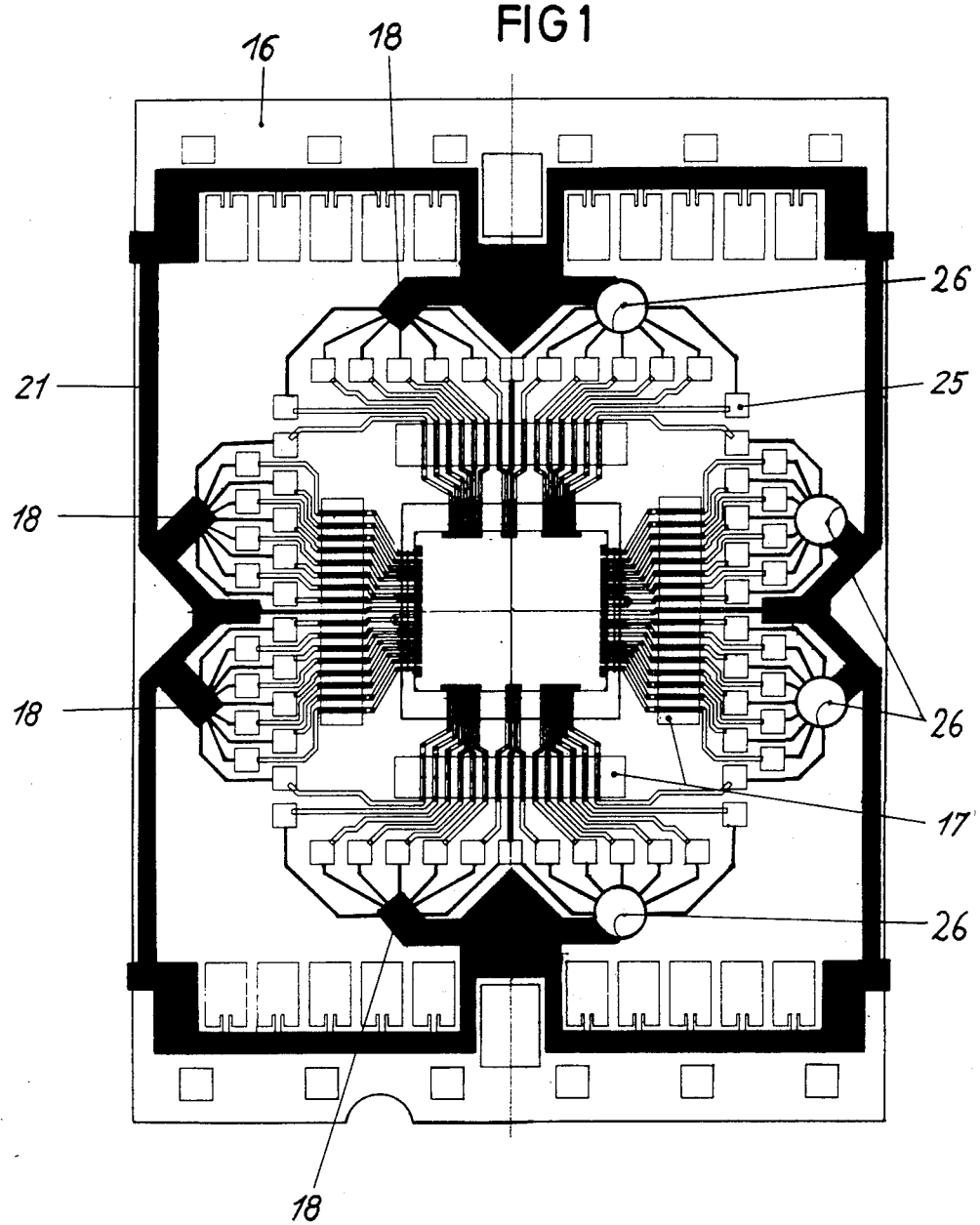
FIG. 1 is a plan view of a film-mounted, integrated circuit protected by a short-circuit track.

FIG. 1 shows the conductor side of a film-mounted, integrated circuit (micropack) 16 wherein outer track electrical connections of the integrated circuit disposed in the center of the micropack are extended beyond their outer contacting region 17 and are combined in short-circuit points 18. These short-circuit points 18 are conductively interconnected by means of a short-circuit track 21 over which they can be grounded. For the electrical check of the integrated circuit in the micropack 16, the outer track connections 17 or the test points 25, must be separated from the track 21. This occurs, for example, by means of punching out the short-circuit points 18, leaving a hole 26 in the micropack 16.

Figure 2:
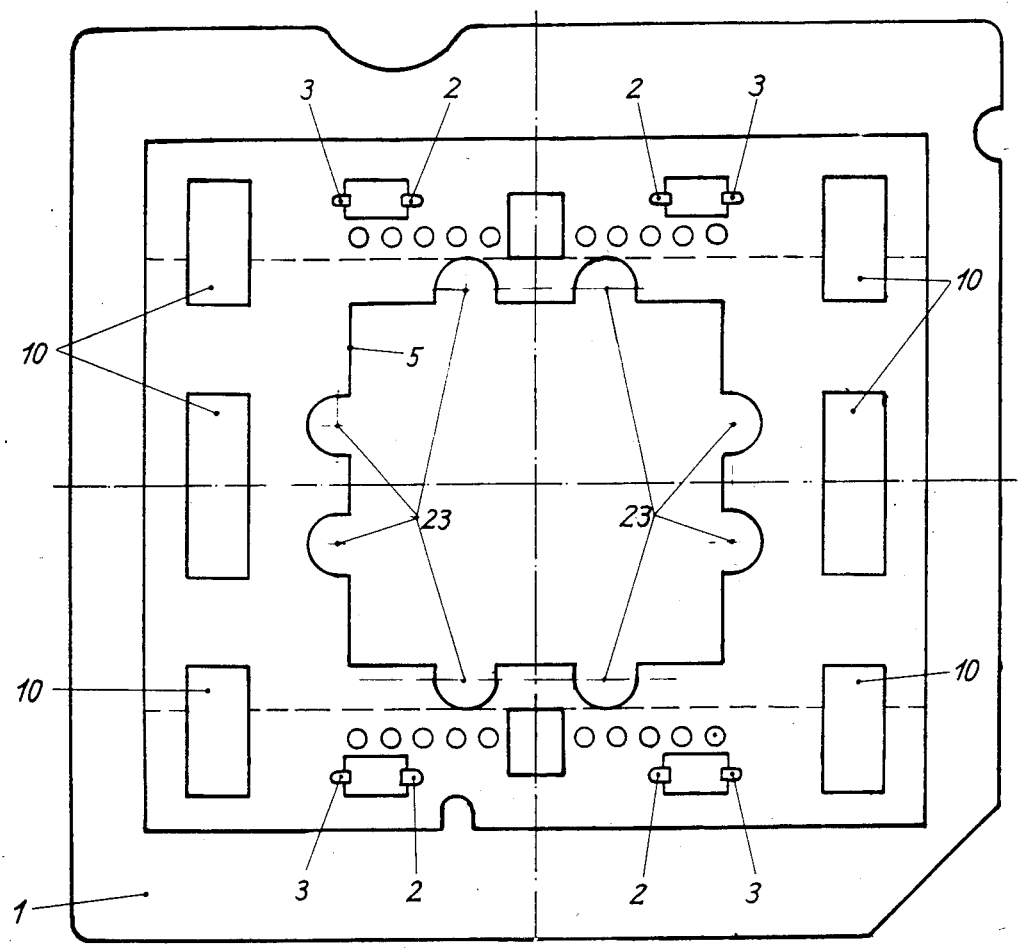
FIG. 2 is a plan view of a sample embodiment of the inventive mounting frame.
Figure 3:
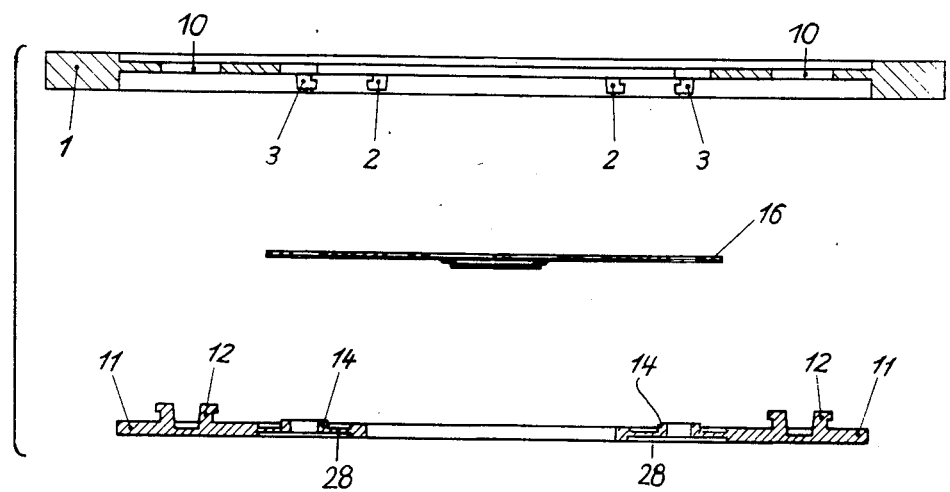
FIG. 3 is an exploded side sectional view of the mutual positions of mounting frame, short-circuit frame and micropack.
Figure 3A:
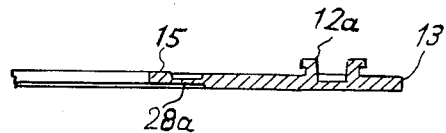
FIG. 3a is a side sectional view of an alternative embodiment of the short-circuit frame.

FIG. 2 shows a sample embodiment of a mounting frame 1 whose outer dimensions essentially correspond to the diapositive frame standard in photographic technology. A central window 5 is provided at its inside for the freely accessible placement of the micropack 16 to be processed. The frame 1 further has retaining means such as noses 2, 3 positioned, for example, at two sides of the frame which engage into perforations in the micropack 16 and which fix the lateral position as well as flatness of the micropack within the frame 1. It can be further seen that the mounting frame 1 exhibits a series of openings 10. As shown in FIG. 3, lock-in nubs or fingers 12 engage into the openings 10, being disposed on the one side of a short-circuit frame 11. Recessed areas 23 in the window 5 are also provided in frame 1, these serving to allow the short-circuit points 18 of the micropack 16 to be punched out even when the micropack is secured in the mounting frame 1.

Figure 4A:
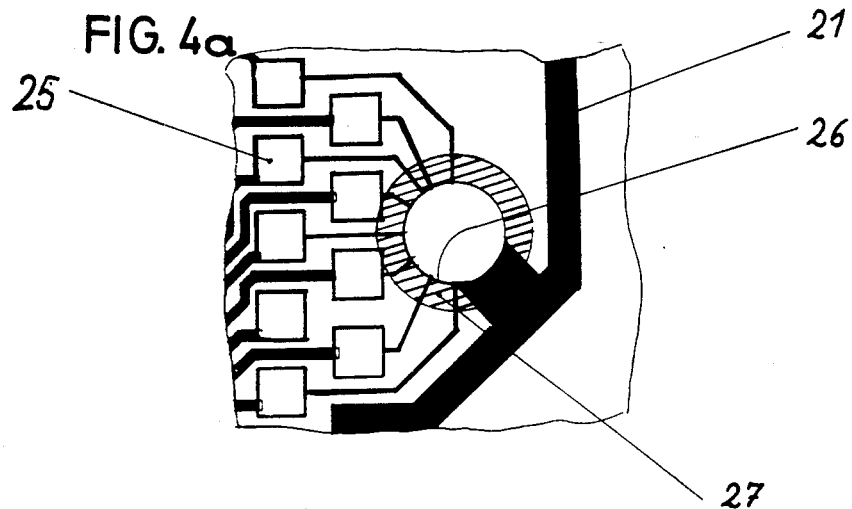
FIG. 4a is a partial view of the integrated circuit of FIG. 1 showing the area contacted by the conductive element of the short-circuit frame generally taken along the lines IVa—IVa of FIG. 4b.

The short-circuit frame 11 exhibits one or more conductive elements 14 coming to lie around the punch hole 26 of the micropack 16 in a contact area 27 shown in FIG. 4a. The conductive elements 14 are connected to the body of the short-circuit frame 11 over webs or membranes 28 as seen in FIG. 4c. The conductive elements 14 are pressed against the regions 27 around the punch holes 26 by means of snapping the short-circuit frame 11 into the mounting frame 1 with the assistance of the lock-in nubs 12, as shown in FIG. 4b.

The short-circuit frame advantageously consists of a synthetic having anti-static properties such as, for example, a synthetic filled with carbon fibers and the conductive elements 14 are metallized at least at their surface. In this manner, the test points are all reconnected to the short-circuit track 21 when the short-circuit frame 11 is secured to the mounting frame 1 and against the micropack 16.

Figure 5:
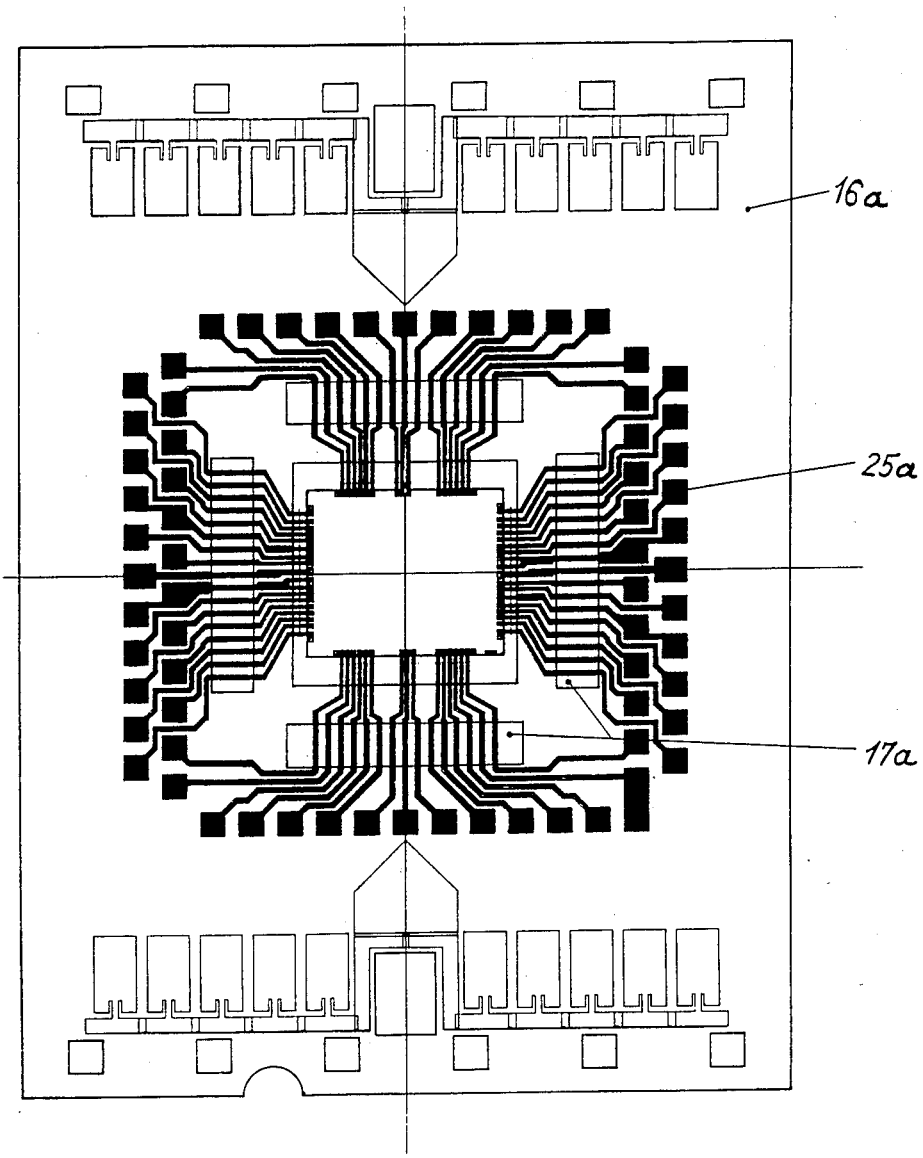
FIG. 5 shows an integrated, film-mounted circuit not protected by a short-circuit conductor configuration.

FIG. 5 shows the example of a film-mounted integrated circuit 16a wherein, in contrast to the sample embodiment integrated circuit of FIG. 1, the outer track connections 17a or, respectively, the test points 25a, are not extended or are not combined in a short-circuit point or grounded over such a point. FIGS. 6a and 6b show how such film-mounted, integrated circuits can be reliably protected against electrostatic charges with the inventive device.

Figure 4B:
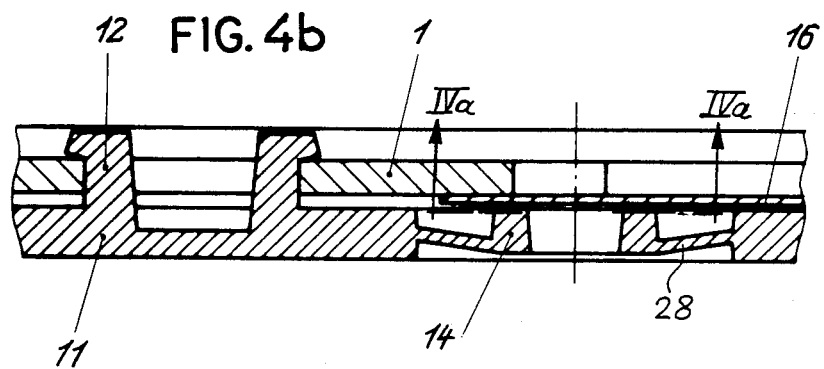
FIG. 4b is a partial side view of the assembled mounting frame, micropack of FIG. 1 and short-circuit frame of FIG. 3.
Figure 4C:
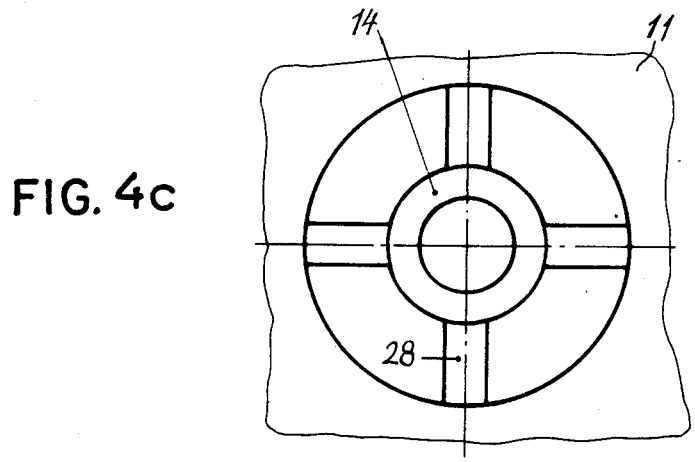
FIG. 4c is a partial plan view of the conductive element of the short-circuit frame.

Instead of annular, conductive elements 14 as shown in FIGS. 4b and 4c, an alternative embodiment of a short-circuit frame 13 exhibits conductive elements 25 in the form of strips or frames which are connected over webs or membranes 28a to the body of the short-circuit frame 13. The strip-shaped or frame-shaped conductive elements 15, given the case of a micropack 16a according to FIG. 5, come to lie, for example, in an area 24 directly above those outer track sections which connect the outer contacting area 17 to the test points 25, as indicated in FIG. 6a. The conductive elements 15 are pressed against the regions 24 by means of snapping the short-circuit frame 13 into the mounting frame 1a with the assistance of the lock-in nubs 12a, as shown in FIG. 6b.

With either embodiment of the short-circuit frame, 11 or 13, when the micropack is ready for use and final assembly, the frame 11 or 13 may be easily disengaged from the mounting frame 1 by appropriate manipulation of lock-in nuts 12 or 12a. The short-circuit frame 11 or 13 is then available for reuse.

As is apparent from the foregoing specification, the invention is susceptible of being embodied with various alterations and modifications which may differ particularly from those that have been described in the preceeding specification and description, in accordance with the shape and configuration of the film-mounted circuits to be protected. It should be understood that I wish to embody within the scope of the patent warranted hereon all such modifications as reasonably and properly come within the scope of my contribution to the art.

I claim as my invention:

1. A device for protecting film-mounted integrated circuits (micropacks) against disruption due to electrostatic charging wherein said micropacks have outer track conductive structures, comprising:
    a mounting frame having a central opening for receiving said micropack in a freely accessible manner and a plurality of retaining means engagable with said micropack for fixing the position and flatness of said micropack, and;
    a short-circuit frame having disengagable and reengagable locking means for securing said short-circuit frame to said mounting frame and planar short-circuit regions aligned to contact said outer track structures of said micropack when said micropack is received in said mounting frame and said short-circuit frame is secured to said mounting frame.

2. The device of claim 1 for use with micropacks having short-circuit points for interconnecting said outer track conductive structures which are removed for testing purposes, wherein said short-circuit region comprises an annular conductive element for overlying said removed short-circuit points on said micropack, said element connected to said short-circuit frame over a membrane.

3. The device of claim 1 wherein said planar short-circuit region is a strip-like conductive element overlying said outer track conductive structures, said element connected to said short-circuit frame over a membrane.

4. The device of claim 1 wherein said planar short-circuit region is a frame-like conductive element overlying said outer track conductive structures, said element connected to said short-circuit frame over a membrane.

5. The device of claim 1 wherein said short-circuit frame is fabricated of a synthetic material having anti-static properties.

6. The device of claim 1 wherein at least the contact surface of said planar short-circuit regions is metallized.

7. The device of claim 2 wherein said mounting frame has openings in the areas of the short-circuit points when said micropack is mounted in said frame whereby said short-circuit points may be punched out when said micropack is mounted in said frame.

8. The device of claim 1 wherein said short-circuit frame may be disengaged from said mounting frame and reused with another mounting frame.

9. A device for protecting film-mounted integrated circuits (micropacks) against disruption due to electrostatic charging wherein said micropacks have outer track conductive structures and mounting perforations, comprising:

a mounting frame having
external dimensions corresponding to those of a diapositive frame standard in photographic technology,
a window centrally provided in its interior for receiving said micropack in a freely accessible manner, and
a plurality of retaining means engagable with said micropack perforations for securing said micropack to said mounting frame; and
a separate short circuit frame having disengagable and reengagable locking means for securing said short-circuit frame to said mounting frame, and
planar short-circuit regions arranged on said short-circuit frame to contact said outer track conductive structures of said mounted micropack when said short-circuit frame is secured to said mounting frame.

10. The device of claim 9 wherein said mounting frame has openings therein for receiving said locking means on said short-circuit frame.

11. A device for protecting film mounted integrated circuit (micropacks) against disruption due to electrostatic charging wherein said micropacks have outer track conductive structures, comprising:

a mounting frame having a central opening for receiving said micropack in a freely accessible manner;
retaining means for fixing the position and flatness of said micropack relative to said mounting frame;
a short-circuit frame separate from said mounting frame having planar short-circuit regions arranged to contact said outer track conductive structures when secured to said mounting frame with a mounted micropack; and
disengagable and reengagable locking means for securing said short-circuit frame to said mounting frame.

* * * * *